[19] United States Patent
Shinohara et al.

[11] 4,232,105
[45] Nov. 4, 1980

[54] PHOTOSENSITIVE LITHOGRAPHIC PRINTING PLATE WITH HYDROPHILIC SUBLAYER

[75] Inventors: Hideaki Shinohara, Houya; Masaru Kato; Yoshiaki Takamatsu, both of Tokyo, all of Japan

[73] Assignee: Oji Paper Co., Ltd., Tokyo, Japan

[21] Appl. No.: 962,700

[22] Filed: Nov. 21, 1978

[30] Foreign Application Priority Data

Sep. 14, 1978 [JP] Japan ............................. 53-112335

[51] Int. Cl.² ........................... G03C 1/52; G03F 7/02
[52] U.S. Cl. ..................................... 430/160; 101/456; 101/457; 101/462; 101/465; 430/155; 430/302; 430/531
[58] Field of Search ............... 96/33, 35.1, 49, 75; 101/456, 457, 462, 465; 430/531, 155, 157, 158, 160, 302

[56] References Cited

U.S. PATENT DOCUMENTS

| 3,265,504 | 8/1966 | Lednard et al. | 96/75 |
| 3,374,094 | 3/1968 | Wainer et al. | 96/33 |
| 3,669,668 | 6/1972 | Watkinson et al. | 96/35.1 X |
| 3,733,200 | 5/1973 | Takaishi et al. | 96/33 X |
| 4,049,746 | 9/1977 | Muzyczko et al. | 96/75 X |

Primary Examiner—Edward C. Kimlin
Attorney, Agent, or Firm—Armstrong, Nikaido, Marmelstein & Kubovcik

[57] ABSTRACT

A photosensitive lithographic printing plate having an excellent printing durability, which comprises a supporting layer, a hydrophilic layer formed on the supporting layer, a photosensitive layer formed on the hydrophilic layer surface and, optionally, a water-proof layer located between the supporting layer and the hydrophilic layer, the photosensitive layer being composed of a photosensitive diazo resin modified by a phenol compound and a water-soluble acrylic polymer compound, and the hydrophilic layer being composed of a resinous component comprising 5 to 40% by weight of a urea compound resin and 60 to 95% by weight of a polyamide resin, and a pigment component.

11 Claims, 4 Drawing Figures

PHOTOSENSITIVE LITHOGRAPHIC PRINTING PLATE WITH HYDROPHILIC SUBLAYER

FIELD OF THE INVENTION

The present invention relates to a photosensitive lithographic printing plate. More particularly, the present invention relates to a photosensitive lithographic printing plate which is capable of being readily developed with water, or a diluted soap aqueous solution, and being converted into a lithographic printing plate which has an excellent durability over a long period of printing and is capable of producing printed images having a high quality.

BACKGROUND OF THE INVENTION

The photosensitive lithographic printing plates which are commercially available at the present time, are classified into two groups, that is, outside type and inside type. The outside type photosensitive lithographic printing plate, which are disclosed, for example, in Japanese Patent Application Publication (Kokoku) No. 47-25481, is prepared by coating a surface-treated aluminium plate surface with a water-soluble photosensitive diazo resin. The photosensitive resin layer of the outside type photosensitive lithographic printing plate is made insoluble by exposure to light. Therefore, when a non-exposed portion of the photosensitive resin layer which is soluble in water or a diluted soap aqueous solution, is removed by water, a lithographic printing plate having desired images is obtained. However, this type of lithographic printing plate is disadvantageous in its poor ink-receiving property and poor durability in printing. In order to eliminate the above-mentioned disadvantages, it is necessary to coat the image surfaces of the lithographic printing plate with an emulsion type lacquer which enhances the ink-receiving property and the durability of the images.

The inside type photosensitive lithographic printing plate has a photosensitive resin layer which contains a water-insoluble reinforcing resin. In this case, the resultant lithographic printing plate has an excellent durability in printing. However, the water-insoluble reinforcing resin in the photosensitive layer causes the photosensitive resin layer to be not capable of being developed with water or an aqueous neutral liquid. Accordingly, the photosensitive layer needs to be developed with a special developing liquid, such as an organic solvent, alkali solution or an aqueous solution of a surface active agent. This type of development is disclosed, for example, in Japanese Patent Application Publication (Kokoku) No. 37-11558. However, the above-mentioned special developing liquid is not preferable in view point of the labor hygiene, the safty of operation and environmental pollution due to the discharged waste liquid from the developing process.

In order to eliminate the above-mentioned problems, Japanese Patent Application Laying-open (Kokai) No. 52-6202 provided a photosensitive lithographic printing plate which comprises a supporting layer comprising a substrate and a hydrophilic surface, and a photosensitive layer which is formed on the hydrophilic surface of the supporting layer and which comprises a mixture of:

(A) a photosensitive diazo resin which has been prepared by pre-condensation polymerizing an aromatic diazonium compound and an aldehyde compound in the presence of an acid catalyst, and by condensation-polymerizing the pre-condensation product on a phenol compound, and;

(B) a water-soluble acrylic polymer containing, as a polymerization component, at least one member selected from acrylic acid and α- and β-substituted acrylic acid derivatives.

The above-mentioned Japanese Laid Open Patent Application also discloses a hydrophilic layer which is located between the substrate and the photosensitive layer so as to form the hydrophilic surface of the supporting layer by the surface of the hydrophilic layer. The hydrophilic layer thus formed is effective for considerably improving the durability and developing property of the resultant photosensitive lithographic printing plate. However, the improved durability of the above-mentioned type of lithographic printing plate is still unsatisfactory from the view point of practical industrial use.

Under the circumstances, it is strongly desired to further improve the durability in printing of the conventional lithographic printing plate. Also, it is desired to improve the printing property of the lithographic printing plate so as not to soil the background of the printed images by the printing plate per se. Moreover, it is desirable that the photosensitive lithographic printing plate have a constant developing property which causes the printing plate to be completely developed under a constant developing condition. Furthermore, it is desirable that the hydrophilic layer and the photosensitive layer can be easily prepared by a simple coating operation.

SUMMARY OF THE INVENTION

An object of the present invention is to provide a photosensitive lithographic printing plate which is capable of being readily developed with water or a diluted soap aqueous solution.

Another object of the present invention is to provide a photosensitive lithographic printing plate capable of being converted into a lithographic printing plate which has an excellent durability of printing and which does not cause the background of the printed images to be soiled.

The above objects can be attained by the photosensitive lithographic printing plate of the present invention, which printing plate comprises:

a supporting layer comprising a substrate and having a hydrophilic surface, and;

a photosensitive layer which is formed on the hydrophilic surface of the supporting layer and which comprises a mixture of:

(A) a photosensitive diazo resin modified with a phenol compound, which resin has been prepared by pre-condensation polymerizing an aromatic diazonium compound an aldehyde compound in the presence of an acid catalyst, by blending the pre-condensation product with a phenol compound, and by complete condensation polymerizing the blend, and;

(B) a water-soluble acrylic polymer containing, as a polymerizing component, at least one member selected from the group consisting of acrylic acid and α- and β-substituted acrylic acid derivatives;

and which printing plate is characterized in that the hydrophilic surface is formed by a surface of a hydrophilic layer located between the substrate and the photosensitive layer, and the hydrophilic layer comprises a resinous component consisting of from 5 to 40% by weight of at least one urea compound resin and from 60 to 95% by weight of at least one polyamide resin, and a pigment component mixed into the resinous component.

DETAILED DESCRIPTION OF THE INVENTION

Figure 1:
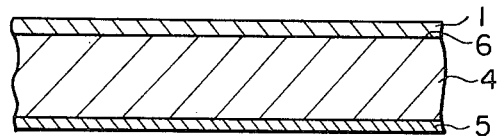
FIG. 1 is an explanatory cross-sectional view of a conventional photosensitive lithographic printing plate.

Referring to FIG. 1, a conventional photosensitive lithographic printing plate has a substrate 4 and a photosensitive layer 1. The upper surface 6 of the substrate 4 is hydrophilic and, therefore, suitable for holding water thereon. Usually, the hydrophilic surface can be provided by grinding or chemically treating the upper surface of the substrate. The substrate 4 may have a backing layer 5 consisting of, for example, an acrylic resin, polyvinyl chloride or polyvinyl alcohol.

Figure 2:
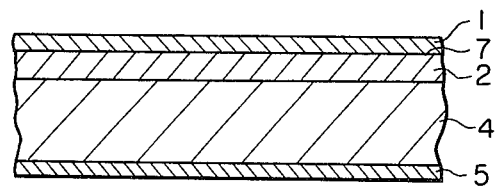
FIGS. 2 and 3 respectively are an explanatory cross-sectional view of an embodiment of the photosensitive lithographic printing plate of the present invention.

Referring to FIG. 2, a photosensitive lithographic printing layer consists of a substrate 4, a hydrophilic layer 2 formed on the substrate 4 and a photosensitive layer 1 coated on the hydrophilic layer 2. The plate has a backing layer 5 formed on the lower surface of the substrate 4. The hydrophilic layer 2 has a hydrophilic surface 7 onto which the photosensitive layer 1 is bonded.

In the photosensitive lithographic printing plate of the present invention, the substrate in the supporting layer consists of a member selected from the group consisting of aluminium plate, zinc plate, copper plate, steel plate, synthetic resin plates, synthetic plastic polymer films, paper, especially, water-proof paper, and composite materials composed of two or more of the above-mentioned materials bonded to each other. Furthermore, the photosensitive layer is made of a mixture of a photosensitive diazo resin modified with a phenol compound and a water-soluble acrylic polymer compound. The modified photosensitive diazo resin is produced by precondensation polymerizing an aromatic diazonium compound and an aldehyde compound in the presence of an acid catalyst, by blending the pre-condensation product with a phenol compound and by complete condensation polymerizing the blend.

The aromatic diazo compound may be selected from the group consisting of unsubstituted and substituted diaphenylamine-4-diazonium salts, unsubstituted and substituted p-arylmercaptobenzene diazonium salts, unsubstituted or substituted p-aryloxybenzene diazonium salts and unsubstituted and substituted p-morpholinobenzene diazonium salts.

The aryl nucleus in the above-mentioned aryl diazonium salts compounds may have one or more substituents selected from the group consisting of, for example, alkyl groups having 1 to 4 carbon atoms, alkoxyl groups having 1 to 4 carbon atoms, halogen atoms, carboxyl groups, carboxyester groups, acyl groups, acylamino groups, alkylamino groups, arylamino groups, sulfonic acid group, alkoxysulfonyl groups, arylsulfonyl groups, cyano group and carboxylic acid amide groups.

The phenyl nucleus in the afore-mentioned benzene diazonium compounds may have one or more substituents selected from the group consisting of, for example, alkyl groups having 1 to 4 carbon atoms, alkoxyl groups having 1 to 4 carbon atoms, halogen atoms, carboxylic ester groups, carboxylic acid groups, acylamino groups, alkylamino groups and arylamino groups.

The aromatic compound which can be converted into the corresponding aromatic diazonium compound usable for the present invention, may be selected from the group consisting of, for example, 4-aminodiphenylamine, 4-amio-4'-methoxy-diphenylamine, 4-amino-4'-chlorodiphenylamine, 4-amino-4'-methyldiphenylamine, 3-amino-4,4'-dimethyldiphenylamine, 4-amino-2-carboxydiphenylamine, 4-amino-4'-chloro-2-carboxydiphenylamine, 4-amino-4'-methyl-2-carboxydiphenylamine, 4-amino-4'-methoxy-2-carboxydiphenylamine, 4-amino-4'-methoxy-2-carboxymethyldiphenylamine, 2-phenoxy-5-chloro-aniline, 4-morpholino-2,5-diethoxyaniline and 4-(p-tolylmercapto)-2,5-diethoxyaniline.

In order to preparing the photosensitive diazo resin, the aromatic diazonium compound may be converted into a corresponding aromatic diazonium salt of a strong acid, for example, sulfuric acid, hydrochloric acid, phosphoric acid, borofluoric acid and an aromatic sulfonic acid, and; then, the resultant diazonium salt compound is subjected to a pre-condensation polymerization with an aldehyde compound. The aldehyde compound usually useful for the present invention, is formaldehyde or paraformaldehyde. However, the aldehyde compound may be another aldehyde compound, for example, acetaldehyde, propionaldehyde, butylaldehyde or benzaldehyde.

The diazonium salt compound can be in the form of a double salt with, for example, a metal halide compound such as zinc chloride, zinc bromide and stannic chloride, or a borofluoride salt. The diazonium double salt compound can react with the aldehyde compound so as to form the diazonium resin.

The phenol compound for modifying the pre-condensed diazo resin may be selected from the group consisting of phenol, cresol, p-tert-butylphenol, p-nonylphenol, xylenol and dihydroxybenzene.

In the preparation of the modified diazo resin, a mixture of 1 molar part of an aromatic diazonium compound, 0.8 to 1.4 molar parts of an aldehyde compound and 2 to 6 molar parts per molar part of the diazonium compound, of an acid catalyst consisting of 90 to 98% phosphoric acid, is pre-condensation polymerized at a temperature of 40° C. for 12 to 24 hours. The reaction mixture, which contains a pre-condensed diazo resin is blended with 0.5 to 1.5 molar part per molar part of the diazonium compound, of a phenol compound without isolating the above resultant pre-condensed diazo resin from the reaction mixture. In this stage, if it is necessary, 0.2 to 1.0 molar part per molar part of the diazonium compound, of the aldehyde compound and 2 to 6 molar parts per molar part of the diazonium compound, of the acid catalyst, that is, phosphoric acid, may be added to the above-prepared blend. The blend is subjected to a complete condensation polymerization at a temperature of 50° C. for 12 to 24 hours. The reaction mixture is diluted with a large amount of water so as to cause the resultant diazo resin to be precipitated from the reaction mixture. The precipitate is separated from the reaction mixture and dried to provide the modified diazo resin. In the preparation of the modified diazo resin, it is preferable that the reaction components are used in the amounts mentioned above. If the amounts of the reaction components used full outside of the range mentioned above, the resultant diazo resin sometimes has an excessively high degree of condensation polymerization, which causes the diazo resin to have a poor solubility in water, or sometimes a excessively low degree of condensation polymerization, which causes the diazo resin to have a poor hardening property.

In the photosensitive layer, it is important that the polymeric molecule of the modified diazo resin has at least one phenolic hydroxyl group. Accordingly, the modified diazo resin usable for the present invention should be definitely distinguished from a conventional resinous mixture of a non-modified diazo resin and a phenol compound or a condensation product of a phenol compound with an aldehyde compound, for example, a novolak resin. This is because these conventional resinous mixtures can not attain the objects of the present invention.

The water-soluble acrylic polymer compound usable for the present invention, contains as polymerization component at least one member selected from the group consisting of acrylic acid and α- and β-substituted acrylic acid derivatives. The acrylic polymer compound can be selected from polyacrylic acid, polymethacrylic acid, copolymers of acrylic acid and methacrylic acid, partially saponified polyacrylic esters, partially saponified polymethacrylic esters and mixtures of two or more of the above-mentioned compounds. It is preferable that the acrylic polymer compound have a degree of polymerization of from 600 to 100,000. Also, it is preferable that the acrylic polymer compound be used in an amount of from 0.4 to 4 times the weight of the modified diazo resin. In the acrylic polymer compound usable for the present invention, it is important that the polymeric molecule of the acrylic polymer compound have at least one free carboxyl group. Therefore, non-saponified polyacrylic esters and polymethacrylic esters are useless for the present invention, because these compounds have no carboxyl group.

It is not completely clear why the mixture of the modified diazo resin and the acrylic polymer compound exhibits an excellent image-forming property and light sensitivity. However, it is assumed that, in the mixture, the modified diazo resin associate with the acrylic polymer compound to form an associated complex substance, and when the associated complex substance is exposed to light so as to cause the modified diazo resin to be photo-decomposed, the photo-decomposition product is firmly bonded with the acrylic polymer compound so as to produce a water-insoluble complex substance.

In order to provide a hydrophilic surface of the supporting layer, a hydrophilic layer is interposed between the substrate and the photosensitive layer. The hydrophilic layer is made of a mixture of a resinous component consisting of 5 to 40% by weight of a urea compound resin and 60 to 95% by weight of a polyamide resin, and a pigment component. This hydrophilic layer has an excellent bonding property to the above-mentioned photosensitive layer. If in the resinous component, the content of the urea compound resin is less than 5% by weight and the content of the polyamide resin is more than 95% by weight, the resultant hydrophilic layer will have a poor bonding property to the photosensitive layer, and therefore, the resultant lithographic printing plate will have a low durability in printing. On the other hand, if the content of the urea compound resin is more than 40% by weight and the content of the polyamide resin is less than 60% by weight, the resultant lithographic printing plate has a poor developing property and printing durability, and causes the banckground of the printed images to be soiled. The importance of the mixing ratio of the urea compound resin to the polyamide resin will be additionally illustrated by means of the examples and the comparison examples set forth hereinafter.

The urea compound resin usable for the present invention is preferably selected from the group consisting of non-modified urea-formaldehyde resins, cation-modified urea-formaldehyde resins modifed with 5 to 20%, based on the weight of the urea, of at least one multifunctional basic compound having two or more basic groups, nonion-modified urea-formaldehyde resins modified with 5 to 15%, based on the weight of the urea, of at least one polyol compound and anion-modified urea-formaldehyde resins modified with 5 to 15%, based on the weight of the urea, of at least one acid sulfite.

The multifunctional basic compound may be selected from the group consisting of dimethylaminoethanol, diethanolamine, oxazolidine, polyphenyldiguanide, tetraethylenepentamine and guanyl urea. The polyol compound may be either ethylene glycol or glycerin. The acid sulfite may be sodium hydrogensulfite, potassium hydrogensulfite or calcium hydrogensulfite.

The polyamide resin usable for the present invention may be selected from the group consisting of nylon 6, nylon 66, nylon 610, modified polyamide resins which have been prepared by modifying at least one member selected from nylon 6, nylon 66, and nylon 610 with a modifying agent consisting of a member selected from mixtures of formaldehyde and aliphatic alcohols, epoxy compounds and mixtures of epichlorohydric and polyamide compounds.

With regard to the modified polyamide resin, it is preferable that the hydrogen atoms corresponding to 2 to 30% of the entire hydrogen atoms in the amide groups of the polyamide are substituted by the above-mentioned modifying agent residues.

The pigment component to be contained in the hydrophilic layer may be selected from conventional pigments such as titanium dioxide, acidic clay and clay. The pigment component is effective for enhancing the hydrophilic property and the coating property of the resinous component. Usually, it is preferable that the pigment component be used in an amount of 0.5 to 2.5 times, more preferably, from 1 to 1.5 times the weight of the resinous component.

In order to enhance the flexibility of the hydrophilic layer, it is effective to add 1 to 100%, based on the weight of the resinous component, of at least one additional resin selected from, for example, polyvinyl alcohol, modified polyvinyl alcohol, casein, copolymer of acrylic acid amide and acrylic ester and modified polyacrylic acid. Also, in order to enhance the hardness of the hydrophilic layer, a small amount of aluminium sulfate may be added to the resinous component.

In the photosensitive lithographic printing plate of the present invention, a water-proof layer may be located between the hydrophilic layer and the substrate.

Figure 3:
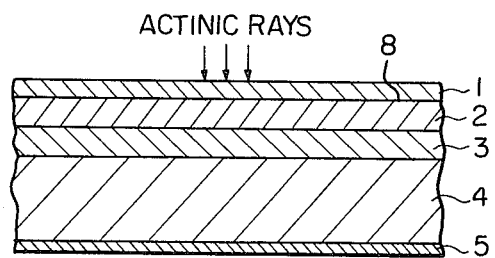
Figure 4:
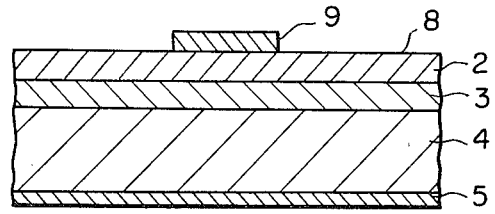
FIG. 4 is an explanatory cross-sectional view of the photosensitive lithographic printing plate of in FIG. 3, which plate has been exposed imagewise to light and then developed.

Referring to FIG. 3, a water-proof layer 3 is formed on the upper surface of the substrate 4 and the hydrophilic layer 2 is formed on the water-proof layer 3. This hydrophilic layer 2 has a hydrophilic surface 8. Then, the photosensitive layer 1 is formed on the hydrophilic layer 2. In FIG. 3, when light is directed onto the surface of the photosensitive layer 1 in the direction shown by arrows in the drawing, the portions of the photosensitive layer 1 exposed to light are insolubilized in water. Therefore, when the exposed photosensitive layer is developed with water or a diluted soap solution, the non-exposed portions of the photosensitive layer are eliminated. Referring to FIG. 4, the light-exposed portion of the photosensitive layer remains so as to form an image 9, and the non-light-exposed portions of the photosensitive layer are completely removed so as to expose the corresponding portions of the hydrophilic surface 8 to the ambient atmosphere. That is, the exposed portions of the hydrophilic surface 8 can behave as a water-holding surface during the printing operation. When a printing ink is applied to the printing surface of the lithographic printing plate, the printing ink is held only by the surface of the image and repelled by the water-holding surface.

The water-proof layer may comprise either a water-proof synthetic resin selected from the group consisting of, for example, polyvinyl chloride, polyurethane, condensation products of polyvinyl alcohol and aldehyde compounds, copolymers of acrylic esters and styrene, and copolymers of styrene and butadiene, or an aluminium foil.

In the case where the water-proof layer is involved in the photosensitive lithographic printing plate of the present invention, the substrate can be made of, for example, paper which has a poor water-proof property. However, the material for providing the substrate is not limited to paper, and can be a water-proof material such as metal plates, synthetic resin plates or synthetic plastic polymer films.

The water-proof layer may contain an additional component, such as titanium dioxide, in an amount of 0.3 to 4.0 times, preferably, from 0.8 to 2.0 times, the weight of the water-proof synthetic resin. The additional component is effective for enhancing the smoothness of the water-proof layer surface and the coating property of the water-proof synthetic resin.

In the preparation of the photosensitive lithographic water-proof synthetic resin. printing plate of the present invention, the mixture of the resinous component and the pigment component are mixed into a solvent to prepare a coating liquid for the hydrophilic layer. The solvent may be either water or an organic solvent, for example, methyl alcohol, cellosolve, dimethylformamide, methylethyl ketone, acetone, xylene, ethyl acetate or a mixture of two or more of the above-mentioned compounds. The coating liquid preferably contains the solid contents in an amount of from 10 to 60% by weight. The coating liquid is applied, preferably, in a solid amount of 5 to 30 g/m$^2$, more preferably, from 10 to 20 g/m$^2$, onto a surface of the substrate. The layer of the coating liquid thus formed on the substrate surface is dried at a temperature of from room temperature to 180° C.

If it is desired, before forming the hydrophilic layer, a water-proof layer is formed on the substrate surface. The coating liquid for the water-proof layer is prepared in a similar manner to that for the hydrophilic layer. However, the coating liquid for the water-proof layer is preferably applied in a solid amount of from 5 to 20 g/m$^2$, more preferably, from 8 to 12 g/m$^2$, onto the substrate surface. After solidifying the water-proof layerf, the hydrophilic layer is formed on the water-proof layer.

Next, the photosensitive layer is formed on the hydrophilic surface by applying a coating liquid containing the photosensitive mixture dissolved in an organic solvent. In order to enhance the coating property and drying property of the coating liquid, it is preferable that the organic solvent be selected from the group consisting of acetone, methylethyl ketone, methyl-n-propyl ketone, methylisobutyl ketone, cyclohexanone, ethyl acetate, methyl cellosolve, ethylcellosolve, methylcellosolve ecetate, ethylcellosolve acetate, methyl alcohol, ethyl alcohol, prophy alcohol, isopropyl alcohol, butyl alcohol, cyclohexanol, dimethylformamide and dimethylacetamide.

The coating property of the coating liquid varies depending upon the type of the photosensitive mixture, the type of the solvent, the content of the photosensitive mixture in the solvent the type of the coating method, the coating device the coating conditions, and the type of the hydrophilic surface. However, it is preferable that the solid content of the photosensitive mixture in the solvent be in a range of from 0.5 to 15% by weight. Also, it is preferable that the coating liquid be applied in a solid amount of 0.5 to 5 g/m$^2$, more preferably, from 1 to 3 g/m$^2$, onto the hydrophilic surface. The coating liquid for the photosensitive layer may contain one or more additives, such as dye, anti-oxidant, anti-static agent, viscosity-regulating agent and film-forming binder, in a proper amount.

The lithographic printing plate having a high quality can be prepared from the photosensitive lithographic printing plate of the present invention in the following manner. The photosensitive layer surface is covered by a negative film or plate and exposed imagewise to actinic rays, for example, sunlight or ultra-violet rays. The exposed portions of the photosensitive layer are insoluble in water and enhanced in oleophilic property. Accordingly, the non-exposed portions of the photosensitive layer can be easily removed by lightly wiping the photosensitive layer with water or a diluted soap aqueous solution. This soap solution usually contains 0.02 to 1.0% by weight of Marseilles soap. The images thus formed may be colored by a proper dye, for example, basic dye or substantive dye. The hydrophilic layer in the photosensitive lithographic printing plate has an excellent bonding property to the photosensitive layer and an insoluble image layer derived from the photosensitive layer. Thereof, the developed lithographic printing plate has a remarkably excellent printing durability which could never be expected from the conventional lithographic printing plates.

When the water-proof layer is provided between the hydrophilic layer and the substrate, the resultant lithographic printing plate also has a significantly excellent printing durability, even if the substrate is composed of paper which has a very poor resistance to water.

Furthermore, the hydrophilic layer surface has a very high water-holding property and oil-repelling property. Therefore, when a printing ink is applied onto the printing surface of the lithographic printing plate, the printed ink is received and held only by the image surfaces which have a high oleophilic property and the ink is completely repelled by the water-holding surface which is the background of the images. This phenomenon causes the printed images to be remarkably clear and the background of the images to be not soiled by the printing ink.

The features and advantages of the process of the present invention are further illustrated by the examples set forth hereinafter, which are not intended to limit the scope of the present invention in any way. In the examples, percent and part are based on weight unless otherwise indicated.

EXAMPLES 1 TO 6 AND COMPARISON

Examples 1 to 4

In each of Examples 1 to 6 and Comparison Examples 1 to 4, a high quality paper having a weight of 150 g/m² and a ratio N/L of 50/50 was used as a substrate in a supporting layer. The paper had an excellent degree of size, resistance to water and smoothness of the surface thereof.

A coating solution for preparing a water-proof layer on each surface of the substrate, was prepared by uniformly mixing 2.5 kg of a solution of 40% by weight of a polyvinyl chloride which was available under the trademark of Denka LAC 21K, produced by Denki Kagaku Kogyo, Japan, and which has a degree of polymerization of about 400, in ethyl acetate, 1 kg of rutile type titanium dioxide and 5 liters of an organic solvent consisting of toluene. The coating solution was uniformly coated in a dry solid weight of 10 g/m² onto each surface of the substrate, and the coating solution layers thus formed were dried. The drying operation did not cause the supporting layer, which was composed of the substrate interposed between two water-proof layers, to be bent. Also, it was confirmed that the thus coated substrate had a high water-proof property.

A hydrophilic layer was provided on one water-proof layer of the supporting layer by the following procedures.

A coating liquid for the hydrophilic layer was prepared from a polyamide resin, a urea compound resin, an anatase type titanium oxide and aluminium sulfate, each in an amount shown in Table 1.

TABLE 1

| | Example | | | | | | Comparison Example | | | |
|---|---|---|---|---|---|---|---|---|---|---|
| Component | 1 | 2 | 3 | 4 | 5 | 6 | 1 | 2 | 3 | 4 |
| Anatase type TiO₂ | 150 | 150 | 150 | 150 | 150 | 150 | 150 | 150 | 150 | 150 |
| Polyamide resin 10% methylol-modified nylon 6 | 85 | 92 | 65 | — | 60 | 75 | — | 100 | 50 | 97 |
| 10% epoxy-modified nylon 6 | — | — | — | 75 | 25 | — | — | — | — | — |
| Urea compound resin 10% diethanolamine-modified urea resin | — | 8 | 35 | — | — | 25 | 100 | — | 50 | 3 |
| 10% ethyleneglycol-modified urea resin | 15 | — | — | 25 | 15 | — | — | — | — | — |
| Aluminium sulfate | 5 | 5 | 5 | 5 | 5 | 5 | 5 | 5 | 5 | 5 |

The coating liquid was applied in a dry solid weight of 12 g/m² onto one water-proof layer surface in the supporting layer by using a four-roller reverse type coating machine. The coated liquid layer was dried at a temperature of 120° C. for one minute.

A modified diazo resin was prepared by the following procedures. 230 parts of 4-diazo-diphenylamine sulfate were uniformly dispersed in 200 parts of phosphoric acid while thoroughly stiring the mixture. 30 parts of paraformaldehyde were added to the dispersion. The resultant reaction mixture was heated at a temperature of 40° C. for 24 hours while agitating it, so as to cause the diazo compound and the aldehyde compound to be pre-condensation polymerized. 94 parts of phenol and, thereafter, 15 parts of paraformaldehyde and 200 parts of phosphoric acid were added to the resultant pre-condensation product. The reaction mixture was heated at a temperature of 50° C. for 24 hours so as to complete the condensation polymerization. The resultant reaction mixture was dispersed in a large amount of water, so as to cause the resultant diazo resin to precipitate from the reaction mixture. The precipitate was filtered, washed with water and dried. A yellow photosensitive diazo resin was obtained in an amount of about 310 parts. After the diazo resin was stored for six months, no change in quality of the resin was found.

A photosensitive mixture was prepared by using the above-prepared modified diazo resin having the following composition.

| | |
|---|---|
| The above-mentioned modified diazo resin | 1 part |
| Water-soluble polyacrylic acid (made by Nihon Junyaku, Japan in the trademark of Junlon 10L) | 0.7 |
| Polyethyleneglycol (made by Lion Oil and Fat, Japan in trademark of PEG 6000) | 0.05 |

The above mentioned photosensitive mixture was dissolved in a solvent having the following composition to prepare a coating liquid for the photosensitive layer.

| | |
|---|---|
| Butylsellosolve | 10 parts |
| Acetone | 20 |
| Methylethyl ketone | 20 |
| Water | 50 |

The above-prepared coating liquid was applied onto the surface of the hydrophilic layer by using a four roll reverse type coating machine, and dried at a temperature of 90° C. The resultant photosensitive layer had a weight of 1.0 g/m². A negative type photosensitive lithographic printing plate having a paper substrate was obtained.

A negative film having a predetermined pattern was closely superimposed on the photosensitive layer surface of the photosensitive lithographic printing plate, and exposed for 30 seconds to actinic rays from a 2 KW super voltage mercury lamp spaced 1 m from the negative film. The surface of the exposed photosensitive layer was wiped with a piece of absorbent cotton impregnated with 0.4% soap aqueous solution so as to develop it.

In order to evaluate the developing property of the photosensitive lithographic printing plate, the wiping operations were carried out until the non-exposed portions of the photosensitive layer were completely removed. The total number of wiping operation required was recorded. After the development was completed, the desired positive images were obtained.

The resultant lithographic printing plate was subjected to a printing test. During the printing test, it was observed how many printing operations could be carried out without a decrease in quality of the printed images to determine the durability in printing of the lithographic printing plate. Also, it was observed how much, if any, the background of the printed images was soiled by the printing plate. Moreover, it was observed how firmly the hydrophilic layer was bonded to the photosensitive layer (developed images). The results are shown in Table 2.

TABLE 2

| Example | | Number of wiping operations (Time) | Durability in printing (Number of printing operation) | Soil on background | Bond between hydrophilic and photosensitive layers |
|---|---|---|---|---|---|
| Example | 1 | 5–6 | 13,000 or more | no | firm |
| | 2 | 5–6 | 15,000 or more | no | firm |
| | 3 | 5–6 | 13,000 or more | no | firm |
| | 4 | 5–6 | 12,000 or more | no | firm |
| | 5 | 5–6 | 14,000 or more | no | firm |
| | 6 | 5–6 | 12,000 or more | no | firm |
| Comparison | 1 | 20 or more | 5,000 | Remarkable | firm |
| Example | 2 | 5–6 | 7,000 | no | weak |
| | 3 | 10 | 5,000 | Considerably | firm |
| | 4 | 5–6 | 8,000 | no | weak |

Tables 1 and 2 clearly show that only in the case where the composition of the polyamide resin and the urea compound resin in the hydrophilic layer is in the range specified in the present invention, does the resultant lithographic printing plate exhibit an excellent durability, in spite of the substrate consisting paper. Also, it is clear that the lithographic printing plate derived from the photosensitive lithographic printing plate of the present invention does not cause the background of the printed images to be soiled. Moreover, Table 2 shows that in the photosensitive lithographic printing plate of the present invention, the hydrophilic layer is firmly bonded to the photosensitive layer or the image layer. The above-mentioned excellent properties of the photosensitive lithographic printing plate of the present invention have never been anticipated from any prior arts.

Examples 7 and 8

In Example 7, the same procedures as those mentioned in Example 2 were carried out, except that a composite sheet composed of aluminium foil laminated on a polyester film having a thickness of 100 microns was used in place of the paper substrate.

In Example 8, procedures identical to those mentioned in Example 3 were repeated, except that the same composite sheet as that mentioned in Example 7 was used in place of the paper substrate.

The developing properties of the resultant photosensitive lithographic printing plates and the printing properties of the lithographic printing plates are shown in Table 3.

TABLE 3

| Example No. | Number of wiping operations (Time) | Durability in printing (Number of printing operation) | Soil of background of printed pages | Bond between hydrophilic and photosensitive layers |
|---|---|---|---|---|
| 7 | 5–6 | 15,000 or more | no | firm |
| 8 | 5–6 | 13,000 or more | no | firm |

Example 9

The same procedures as those mentioned in Example 5 were carried out, except that the paper substrate was replaced by a polyester film, 100 microns thick, which has been surface-treated by corona discharge. The developing property and printing properties of the product of this example are shown in Table 4.

TABLE 4

| Example No. | Number of wiping operations (Time) | Durability in printing (Number of printing operation) | Soil of background of printed images | Bond between hydrophilic and photosensitive layers |
|---|---|---|---|---|
| 9 | 5–6 | 14,000 or more | no | firm |

What we claim is:

1. A photosensitive lithographic printing plate comprising:
   a supporting layer comprising a substrate and having a hydrophilic surface, and;
   a photosensitive layer which is formed on said hydrophilic surface of said supporting layer and which comprises a mixture of:
   (A) a photosensitive diazo resin modified with a phenol compound, which resin has been prepared by pre-condensation polymerizing an aromatic diazonium compound and an aldehyde compound in the presence of an acid catalyst, by blending salt pre-condensation product with a phenol compound, and by completely condensation polymerizing said blend, and;
   (B) a water-soluble acrylic polymer compound containing, as a polymarization component, at least one member selected from the group consisting of acrylic acid and α- and β-substituted acrylic acid derivatives, which printing plate is characterized in that said hydrophilic surface is formed by a surface of a hydrophilic layer located between said substrate and said photosensitive layer, said hydrophilic layer comprising (I) a resinous component consisting of (a) from 5 to 40% by weight of at least one urea compound resin selected from the group consisting of non-modified urea-formaldehyde resins, cation-modified urea-formaldehyde resins modified with 5 to 20% based on the weight of the urea, of at least one multifunctional basic compound having two or more basic groups, nonion-modified urea-formaldehyde resins modified with 5 to 15%, based on the weight of the urea, of at least one polyol compound and anion-modified urea-formaldehyde resins modified with 5 to 15%, based on the weight of the urea, of at least one acid salt of sulfurous acid, and (b) from 60 to 95% by weight of at least one polyamide resin selected from the group consisting of nylon 6, nylon 66, nylon 610, modified polyamide resins which have been prepared by modifying at least one member selected from the group consisting of nylon 6, nylon 66 and nylon 610, with a modifying agent consisting of a member selected from the group consisting of mixtures of formaldehyde and aliphatic alcohols and epoxy compounds, and mixtures of epichlorohydrin and polyamine compounds, and (II) a pigment component mixed into said resinous component.

2. A photosensitive lithographic printing plate as claimed in claim 1, wherein a water-proof layer is located between said hydrophilic layer and said substrate, said water-proof layer comprising either a water-proof synthetic resin selected from the group consisting of polyvinyl chloride, polyurethane, condensation products of polyvinyl alcohol and aldehyde compounds, copolymers of acrylic esters and styrene and copolymers of styrene and butadiene, or an aluminium foil.

3. A photosensitive lithographic printing plate as claimed in claim 1, wherein said multifunctional basic compound is selected from the group consisting of dimethylaminoethanol, diethanolamine, oxazolidine, polyphenyldiguanide, tetraethylenepentamine and guanyl urea.

4. A photosensitive lithographic printing plate as claimed in claim 1, wherein said polyol compound is either ethylene glycol or glycerin.

5. A photosensitive lithographic printing plate as claimed in claim 1, wherein said modified polyamide contains the amide groups in which the hydrogen atoms corresponding to 2 to 30% of the entire hydrogen atoms are, substituted by said modifying agent residue.

6. A photosensitive lithographic printing plate as claimed in claim 1, wherein said substrate consists of a member selected from the group consisting of aluminium plate, zinc plate, copper plate, steel plate, synthetic resin plates, synthetic plastic polymer films, paper and composite materials compared of two or more of the above-mentioned members bonded to each other.

7. A photosensitive lithographic printing plate as claimed in claim 1, wherein said aromatic diazonium compound is selected from unsubstituted and substituted diphenylamine-4-diazonium salts, unsubstituted and substituted p-arylmercaptobenzene diazonium salts, unsubstituted and substituted p-aryloxybenzene diazonium salts, and unsubstituted and substituted p-morpholinobenzene diazonium salts.

8. A photosensitive lithographic printing plate as claimed in claim 1, wherein said aldehyde compound is selected from the group consisting of formaldehyde, paraformaldehyde, acetaldehyde, propionaldehyde, butylaldehyde and benzaldehyde.

9. A photosensitive lithographic printing plate as claimed in claim 1, wherein said phenol compound is selected from the group consisting of phenol, cresol, p-tertbutylphenol, p-nonylphenol, xylenol and dihydroxylbenzene.

10. A photosensitive lithographic printing plate as claimed in claim 1, wherein said polyacrylic polymer compound is selected from the group consisting of polyacrylic acid, polymethacrylic acid, copolymers of acrylic acid and methacrylic acid, partially saponified polyacrylic esters, partially saponified polymethacrylic esters, and mixtures of two or more of the above-mentioned compounds.

11. A photosensitive lithographic printing plate as claimed in claim 1, wherein said polyacrylic polymer compound is in an amount of 0.4 to 4 times that of said modified diazo resin.

* * * * *